Nov. 9, 1965 M. FRASER ETAL 3,216,088
BONDING OF METAL PLATES TO SEMI-CONDUCTOR MATERIALS
Filed Dec. 22, 1961
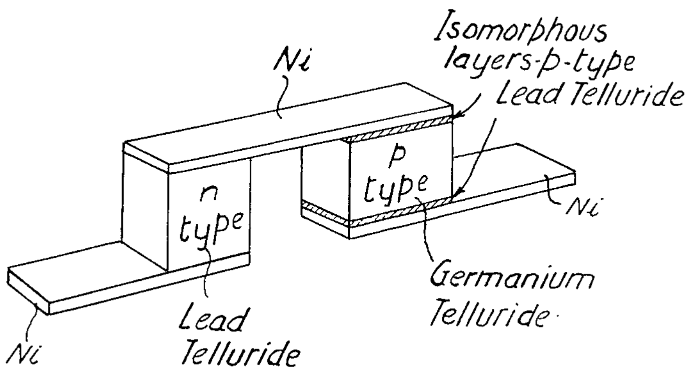
INVENTORS
MURDO FRASER
GRAHAM PARR TILLY
ATTORNEY

United States Patent Office 3,216,088

Patented Nov. 9, 1965

3,216,088

BONDING OF METAL PLATES TO SEMI-CONDUCTOR MATERIALS

Murdo Fraser, Rugby, and Graham Parr Tilly, Uckfield, Sussex, England, assignors to Associated Electrical Industries Limited, London, England, a British company Filed Dec. 22, 1961, Ser. No. 161,520
Claims priority, application Great Britain, Jan. 9, 1961, 883/61
6 Claims. (Cl. 29—155.5)

The present invention relates to the bonding together of a metal and a semi-conductor material and has one particular application to the production of semi-conductor thermo-electric devices.

Such devices generally comprise two limbs of semi-conductor intermetallic compound (which may be of different material) characteristic of opposite conductivity type, connected together at one end through a common metal plate bridge, which serves either as the hot or cold junction, and bonded at their other ends to separate metal plates. It is obviously desirable that the bonds between the semi-conductor materials and the metal plates should be as firm and strong as possible and in addition that the bonds should allow good electrical and thermal contact therebetween.

Hitherto, the most satisfactory bonds between semi-conductor materials and metal plates have been obtained by alloying, but when the limbs of a thermo-electric device are formed of different semi-conductor materials, a metal which is suitable for alloying with the material of one limb may be unsuitable for alloying with the material forming the other limb. Furthermore it is often impossible to find any metal from which the common plate can be formed which is compatible with both semi-conductor materials, particularly in respect of thermal expansion, and in the formation of a satisfactory bond therebetween. For example, if one limb is formed of n-type lead telluride, then a metal suitable in all respects for bonding to this material is nickel, a satisfactory bond being maintained in this case both during manufacture and subsequent operation at high temperature. For operational purposes, however, it may be desired to use p-type germanium telluride in the second limb, but this material does not form a satisfactory bond with nickel. Hence it is usually necessary to compromise by selecting a metal which matches each semi-conductor material as far as possible, at the same time maintaining a reasonable, if not particularly satisfactory, bond therebetween.

An object of the present invention is to provide an improved bond between a semi-conductor material and a metal which are incompatible with each other.

A further object of the invention is to provide improved semi-conductor thermo-electric devices in the production of which the bonding of a metal to a semi-conductor material incompatible therewith is required.

According to the present invention, a metal and a semi-conductor material incompatible with each other are indirectly bonded together through the intermediary of an isomorphous layer of another semi-conductor material, said other semi-conductor material being compatible with the metal.

The intermediate layer is preferably formed by applying the semi-conductor material of which it is constituted in powder form to the required area of the metal, melting it, and allowing it to solidify prior to the main alloying operation. The intermediate layer may conveniently be of the order of 0.1 millimetre thickness in practice.

In the application of the invention to a typical semi-conductor thermo-electric device, one limb of the device formed of a body of semi-conductor material is bonded to a plate of a metal compatible therewith by alloying the metal to the semi-conductor material. The second limb, formed of a second body of semi-conductor material incompatible with the metal, is indirectly bonded thereto through an intermediate thin layer of another semi-conductor material of the same cross-sectional area, said other semi-conductor material being selected so that it is compatible with the metal plate thus forming a satisfactory bond therewith. In such a device, the two limbs are constructed of semi-conductor materials, wholly characteristic of opposite conductivity types.

For a better understanding of the invention, reference will now be directed to the accompanying drawing, which shows in perspective view a thermo-electric device embodying the invention.

As shown in the drawing, a thermo-electric device comprises two bodies 1, 2, both of semi-conductor material, body 1 being of one type conductivity, and body 2 of opposite type conductivity. The bodies are joined together to provide a thermo-electric junction by being bonded at their respective upper ends to a metal plate 3, their lower ends being similarly bonded to respective terminal metal plates 4 and 5. A series circuit is thus formed between the terminal plates 4 and 5 by way of the semi-conductor body 1, the plate 3 and the semi-conductor body 2. The plate 3 thus constitutes the junction between the bodies 1, 2, which is maintained, during operation, at a temperature different from that of the terminal plates 4 and 5.

In a specific embodiment of the invention, the body 1 may be of lead telluride of N-type conductivity, and the body 2 of germanium telluride of P-type conductivity, while the metal plates 3, 4 and 5 are constituted of nickel. The body 1 of lead telluride may be made of N-type conductivity by doping with iodine with a concentration of $5\times10^{-19}$ atoms per cubic centimetre. The germanium telluride used for the body 2 is inherently of P-type conductivity; such material may, and is well-known, be doped with bismuth if it is required to change its inherent resistivity.

No difficulty is found in bonding the metal plates 3 and 4 to the body 1, since nickel and lead telluride are compatible and may be alloyed with one another. The nickel plates may be bonded to the semi-conductor body 1 by heating the body and the plates in contact with one another to a temperature of 720° C. ±15° C. in a protective atmosphere such as hydrogen, or a mixture of hydrogen and argon.

Difficulty, however, is experienced in bonding nickel to germanium telluride, since these two materials are incompatible with one another. However, the bonding can be effected, in accordance with the invention, through the intermediary of an intervening isomorphous layer of another semi-conductor material, e.g. lead telluride of P-type conductivity. Such layers are shown at 6 and 7 as being employed to bond the upper and lower ends, respectively, of the body 2 to the plates 3, 4.

The P-type lead telluride used for the intermediate layers 6, 7 may be constituted of stoichiometric proportions of lead and tellurium, such material being inherently of P-type conductivity. Alternatively, lead telluride not of stoichiometric proportions may be doped with silver to obtain P-type conductivity material.

To effect the bond between body 2 and plates 3, 4, a layer of P-type lead telluride is placed on the required area of the nickel plate 3 to which the body 2 is to be bonded, the nickel with the layer in position being then heated in order to cause the lead telluride to alloy with the nickel. Preferably, the layer of lead telluride is applied to the nickel plate in the form of powder of sufficient fineness to pass through a 400 mesh screen. Alloying may be effected by heating the nickel plate with the powder in position thereon to a temperature of 720° C. ±15° C., again in a protective atmosphere of hydrogen, or hydrogen-argon mixture.

Since the temperature required to alloy the intermediate layers 6, 7 to the nickel is the same as that required to bond the nickel to the body 1, the bonds can be performed in a single operation.

After the intermediate layers have been formed on the nickel plates 3 and 5, the body 2 is placed in contact with the coated areas of the plates, and bonding of the body 2 to the plates is then effected by heating the assembled body and plates to a temperature of between 685° and 700° C., again in a protective atmosphere of hydrogen, or hydrogen and argon. The temperature to which it is necessary to heat the body 2 in contact with the plates 3 and 5 depends on the constitution of the lead telluride, and whether or not it is doped. Since, however, the temperature required to bond the body 2 to the nickel plates 3, 5 through the intermediary of layers 6, 7, is lower than that required to form the bond between the body 1 and the plates 3, 4, no difficulty is experienced when the bonding to the body 2 is effected, in so far as the already formed bond between the body 1 and the plates 3, 4 is concerned.

During operation of the thermo-electric device, although the thermo-electric properties of P-type lead telluride are adversely affected by its being in contact with nickel, the quantity of lead telluride used when compared with the quantity of P-type germanium telluride in the same limb is so small that such adverse effects as are present are negligible.

The fact that the intermediate layer still has appreciable thermo-electric properties means that it does contribute to the overall performance of the device; this would not be the case if, say, a metal compatible with nickel and germanium telluride were used for the intermediate layer, such metal not having as good thermo-electric properties as a semi-conductor. Furthermore, the intermediate layer may also act as a buffer layer preventing possible diffusion of metal into the semi-conductor body 2.

While we have sought to describe a preferred embodiment of the invention, it will be realised that the invention in its broader aspects is limited only by the scope of the appended claims.

What we claim is:

1. A method of bonding a nickel plate to a body of germanium telluride of p-type conductivity, which consists in applying to the area of said plate to be bonded to said body a layer of lead-telluride of p-type conductivity, heating said plate to a temperature of about 720° C. to alloy said layer to said plate, and then heating said body and said plate whilst in contact with one another over said layer to a temperature of about 690° C. so as to fuse said layer and cause said plate to be bonded to said body through said layer.

2. A method as claimed in claim 1, in which said layer is applied to said plate in the form of powder.

3. A method as claimed in claim 1, in which said heating is carried out in a protective atmosphere of a gas selected from the group consisting of hydrogen and argon.

4. In a process of forming a thermo-electric device comprising a body of lead telluride of N-type conductivity and a body of germanium telluride of P-type conductivity and a nickel plate forming an electrical conducting connection between respective ends of said bodies, the steps comprising applying a layer of P-type lead telluride to the area of said plate to be bonded to said body of germanium telluride, assemblying said nickel plate in contact with said body of lead telluride, heating the assembly to a temperature of about 720° C. in a protective atmosphere to alloy said body of lead telluride and said coating of P-type lead telluride to said nickel plate, assembling said body of germanium telluride in contact with said coating of P-type lead telluride alloyed to said nickel plate, and heating the assembly to a temperature of about 690° C. in a protective atmosphere in order to bond said body of germanium telluride through said coating of P-type lead telluride to said nickel plate.

5. The method of bonding to a semi-conductor material a metal with which the semi-conductor material is incapable of forming an effective and lasting bond by heating the material to a fusing temperature while in contact with the metal, comprising the steps of applying to the area of the metal to be bonded to the material a layer of a semi-conductor material which is capable of forming an effective and lasting bond with said metal and said first semi-conductor material, the two semi-conductor materials being isomorphous; alloying the layer to the metal; and then bonding the metal to the first semi-conductor material through the intermediary of the layer by heating the layer to a fusing temperature while said first semi-conductor material is in contact with the layer.

6. The method of bonding to a body of semi-conductor material a metal with which the semi-conductor material is incapable of forming an effective and lasting bond by heating the material to a fusing temperature while in contact with the metal, comprising the steps of applying in powder form to the metal over the area to be bonded to the body a layer of a second semi-conductor material which is capable of forming an effective and lasting bond with the metal and said first semi-conductor material, the two semi-conductor materials being isomorphous; heating the metal to alloy the layer to the metal; and then heating the body and the metal while in contact with one another over the layer so as to fuse the layer and cause the metal to be bonded to the body through the layer.

References Cited by the Examiner

UNITED STATES PATENTS

| | | | |
|---|---|---|---|
| 2,496,346 | 2/50 | Haayman et al. | 29—472.9 X |
| 2,856,681 | 10/58 | Lacy | 29—472.9 |
| 2,977,400 | 3/61 | Cornish | 136—5 |
| 3,000,092 | 9/61 | Scuro | 29—472.9 |
| 3,005,861 | 10/61 | Tiller et al. | 136—5 |

WHITMORE A. WILTZ, *Primary Examiner.*

JOHN H. MACK, *Examiner.*